US007772568B2

(12) United States Patent
Horikoshi et al.

(10) Patent No.: US 7,772,568 B2

(45) Date of Patent: Aug. 10, 2010

(54) MICRO SAMPLE HEATING PROBE AND METHOD OF PRODUCING THE SAME, AND ANALYZER USING THE MICRO SAMPLE HEATING PROBE

(75) Inventors: Kazuhiko Horikoshi, Yokohama (JP); Naotoshi Akamatsu, Fujisawa (JP); Toshiaki Otani, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 148 days.

(21) Appl. No.: 12/204,896

(22) Filed: Sep. 5, 2008

(65) Prior Publication Data

US 2009/0072135 A1 Mar. 19, 2009

(30) Foreign Application Priority Data

Sep. 19, 2007 (JP) ............................. 2007-242375
Jul. 7, 2008 (JP) ............................. 2008-176750

(51) Int. Cl.
*H01J 49/26* (2006.01)
*H01J 37/20* (2006.01)
*G01N 30/02* (2006.01)

(52) U.S. Cl. ................ 250/443.1; 250/288; 435/286.7; 435/290.2

(58) Field of Classification Search ................ 250/288, 250/443.1; 73/23.35, 23.37; 435/285.2, 435/286.1, 286.2, 286.7, 287.1, 290.2, 807
See application file for complete search history.

(56) References Cited

U.S. PATENT DOCUMENTS

2006/0021666 A1* 2/2006 Funatsu et al. .............. 137/828
2008/0280776 A1* 11/2008 Bashir et al. .................. 506/9
2008/0290290 A1* 11/2008 Nagakubo et al. ........ 250/443.1

FOREIGN PATENT DOCUMENTS

JP 08-148116 6/1996
JP 2003-107061 4/2003
JP 2008-003016 1/2008

OTHER PUBLICATIONS

Kanayama, "Micro Thermal Analysis of Polymer Materials Using Scanning Probe Microscopy", Fujifilm Research & Development (No. 47-2002), pp. 44-49.

* cited by examiner

*Primary Examiner*—Bernard E Souw
(74) *Attorney, Agent, or Firm*—Antonelli, Terry, Stout & Kraus, LLP.

(57) ABSTRACT

An object of the present invention is to extract a micro foreign body of a few μm, which may cause a product defect of a device or the like, and to subject the foreign body to a mass analysis at a favorable S/N ratio without any contamination. A micro sample heating probe includes a sample holder made up of two members different in diameter, a supporting part, and a terminal part. The sample holder includes a heating mechanism only in a limited part, and just a region extremely close to the micro sample being an analysis target is heated locally. Therefore, even when a contaminated substance is attached to the probe, such substance is not heated, thereby preventing a noise from occurring, and enabling an analysis at a quite favorable S/N ratio.

15 Claims, 9 Drawing Sheets

S/N=(s1+s2)/N

MICRO SAMPLE HEATING PROBE AND METHOD OF PRODUCING THE SAME, AND ANALYZER USING THE MICRO SAMPLE HEATING PROBE

FIELD OF THE INVENTION

The present invention relates to a micro sample heating probe and a method of making the same, and an analyzer and an analytical method using the micro sample heating probe.

DESCRIPTION OF THE RELATED ART

A micro fine particle of a few μm, which is generated during a process for manufacturing a precision electronic device, is a critical problem that may cause a product defect. In particular, in a step for manufacturing a liquid crystal display, which heavily uses organic materials, a micro foreign body of polymer organic substance may cause a deterioration of yield.

Mass spectrometry is effective for identifying an unknown organic compound. Since the mass spectrometry requires vaporization and ionization of a sample, if the sample is refractory, such as the polymer organic substance, the sample has to be rapidly heated for thermal decomposition.

In the mass spectrometry as described above, it is desirable to extract and isolate the micro foreign body as an analytical object in advance. This is because if a periphery portion other than a target object comes to be mixed in, when the foreign body is extracted, information of the periphery portion may deteriorate S/N ratio (signal to noise ratio) of the target foreign body.

There is also a possibility that contamination caused by a hydrocarbon or a like, entering from the outside, causes the S/N ratio deterioration, the contamination occurring at the time when the micro foreign body is extracted, or during the period from the time when the foreign body is extracted to the time when an analysis is conducted.

In a sampling (a setting of assay samples for the mass spectrometer) for the conventional mass spectrometry, generally, a solid micro foreign body is extracted by a needlepoint using a needle-shaped probe, and thereafter, the probe is mounted on a sampling holder prepared for analysis.

By way of example, when a direct inlet probe is used, which is generally prepared as an option for a commercially available gas chromatograph mass spectrometer, a micro foreign body sample is inserted in a container made of quartz glass with a size approximately ϕ1 mm× a few mm in depth. Then, the quartz glass container having the micro foreign body sample is heated by a heater, and the sample is subjected to the thermal decomposition and vaporization, so as to conduct the analysis.

There is also an apparatus having a mechanism to set the sample in a Pt container, allowing the container to be dropped into a heated furnace for rapidly heating (for example, see Japanese Patent Laid-open Publication No. 2003-107061, hereinafter, referred to as "patent document 1").

In the technique described in the patent document 1, the micro sample is set within the Pt cup and introduced into the heating chamber. However, this kind of Pt cup has a large volumetric capacity even for a micro sample, and therefore a significant noise to a target signal may occur, the noise being caused by contamination. Therefore, in the conventional technique, it has been difficult to obtain data at a favorable S/N ratio for analyzing the micro sample of a few μm.

In view of the problem above, an object of the present invention is to accurately analyze the micro sample by using the configuration as described below.

SUMMARY OF THE INVENTION

In order to solve the problem above, the micro sample heating probe according to the present invention provides a technique for introducing the micro sample being extracted into the mass spectrometer without contamination, and locally heating only the sample part, so as to subject the sample to vaporization and pyrolysis.

By way of example, the micro sample heating probe according to the present invention is provided with a wire, a wire supporting member, and a terminal provided on the wire supporting member for supplying power to the wire, wherein, the wire is made up of a first wire having a first diameter for holding and heating the sample, and a second wire having a second diameter for connecting the first wire to the wire supporting member, and the first diameter is smaller than the second diameter.

A method of making the micro sample heating probe according to the present invention is a method to make the micro sample heating probe having a wire for holding and heating the sample and the wire supporting member, including a step for forming a second wire made of different metallic materials respectively for a center of the wire and for the outer periphery covering the center, and forming a first wire by melting a metal that coats the outer periphery, at a desired part of the second wire, thereby rendering the diameter of the desired part being smaller than that of the other part.

An analyzer according to the present invention for analyzing a micro sample, includes a sample introducer for introducing the micro sample being evaporated, an ion source for ionizing the micro sample, a detector for detecting the micro sample, and a heating source, wherein, the sample introducer detachably connects a micro sample heating probe including a first member with a first diameter for holding and heating the micro sample to be introduced, and a second member with a second diameter being larger than the first diameter.

According to the present invention, it is possible to provide a technique that enables extracting and analyzing the micro sample of a few μm at a favorable S/N ratio.

DESCRIPTION OF THE PREFERRED EMBODIMENTS

Firstly, a mechanism of the present invention for obtaining a high S/N ratio will be explained, prior to describing each embodiment.

Figure 1:
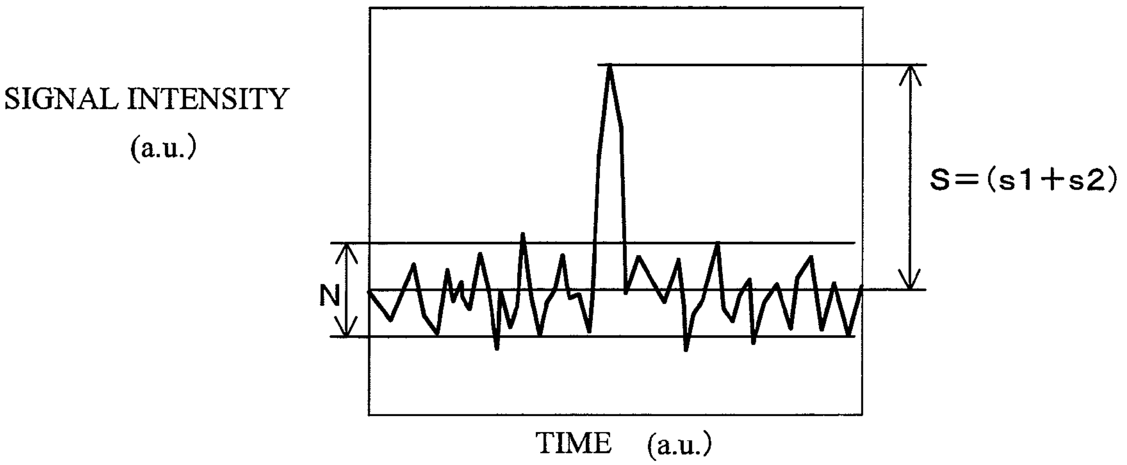
FIG. 1 is a conceptual diagram to explain detection sensitivity.

FIG. 1 illustrates the S/N ratio, which is generally defined. In the figure, "N" indicates a noise caused by an apparatus, and "S" indicates a signal detected by a detector. Here, the S/N ratio serves as an index of sensitivity of an analytical system.

In analyzing a sample, if contamination and the like, other than the target sample, are attached to a heated region, the contamination and the like are also subjected to heating and vaporization, and introduced into the detector.

Here, if the volume of the target sample, being heated and vaporized to be introduced into the detector is assumed as "s1", and the volume of a contaminated substance introduced into the detector, other than the target sample, is assumed as "s2", the signal S detected by the detector is equal to "s1+s2" and S/N ratio for the analytical system is equal to "(s1+s2)/N".

In this situation, it is s1/N that is important in analyzing the target sample.

For example, if s2 is significantly small relative to s1, it is possible to assume that S/N=s1/N. Therefore, analysis of the target sample can be conducted satisfactorily.

On the other hand, if s2 is too large to neglect, it could end up with analyzing the contaminated substance rather than the target sample.

In addition, the target sample as an object of the present invention ranges in size from one to several tens of μm. Here, in case that the target sample is a cube, 3 μm on a side, and the contaminated substance of equivalent amount is attached thereto in a form of monolayer is assumed.

If the thickness of such monomolecular layer is assumed as 0.5 nm, and a coverage factor is assumed as 10%, the area thereof becomes approximately $5\times10^5$ $\mu m^2$.

Therefore, when this area is heated, s1 becomes equal to s2 (s1=s2), and a signal occurs from the contaminated substance, the amount of which is equivalent to the target sample, resulting in that S/N (s1/N) ratio is made to half.

When the amount of the contaminated substance becomes equal to or more than twice the target substance (s1≦2×s2), it is almost impossible to identify the sample of an unknown substance.

Since it is considered that at least the heated region has to be $1\times10^6$ $\mu m^2$ (1 $mm^2$) or less, it is preferable to set the area of the heated region to be $5\times10^5$ μm in order to conduct a highly precise analysis.

According to the present invention, the heated region of the probe is restricted locally, and a favorable S/N ratio can be achieved.

Hereinafter, preferred embodiments of the present invention will be explained with reference to the accompanying drawings.

First Embodiment

In the first embodiment, an explanation will be made with reference to FIG. 2A and FIG. 2B, as to the probe having a system to heat a sample, by using Joule heat that is generated when energizing a metallic wire.

Figure 2A:
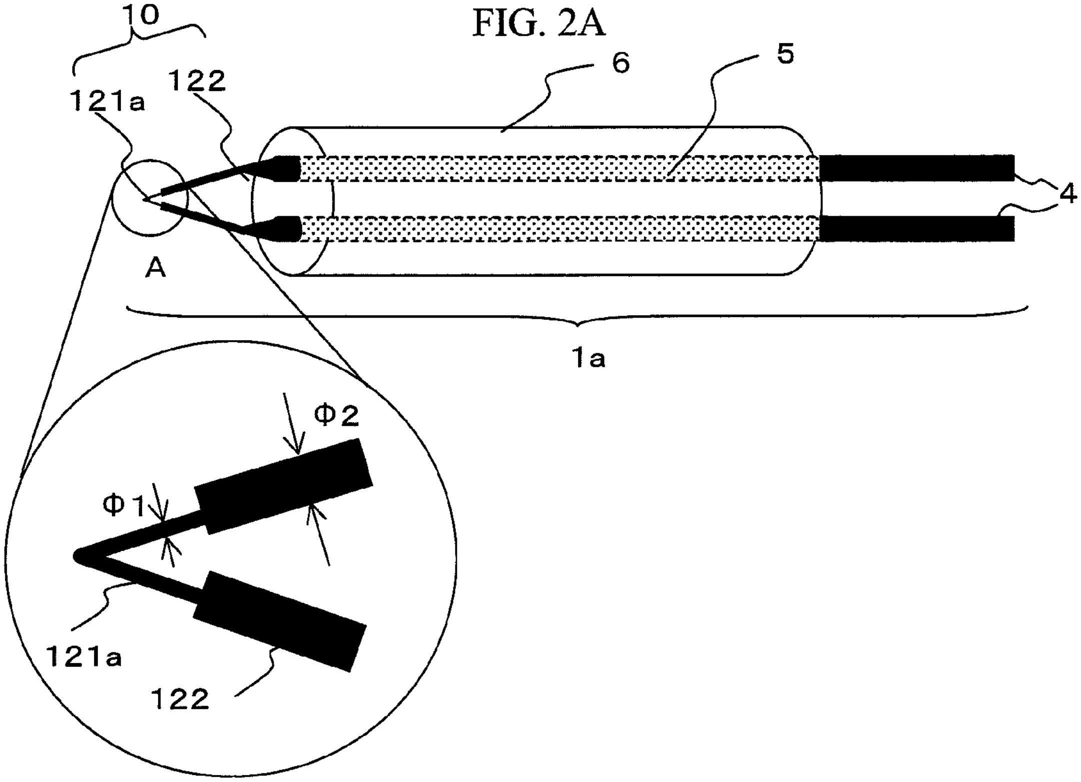
FIG. 2A is a schematic illustration of a micro sample heating probe 1*a* that employs a metallic wire with an acute-angled tip.
Figure 2B:
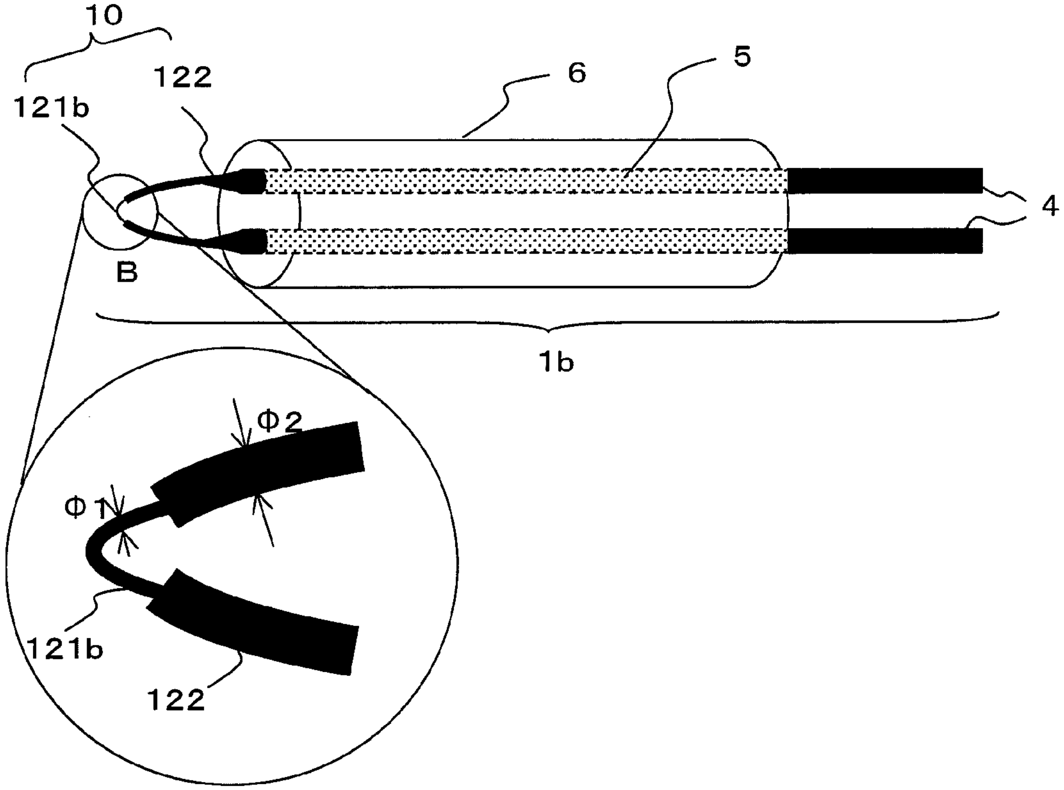
FIG. 2B is a schematic illustration of a micro sample heating probe 1*b* that employs a metallic wire with a circular-arc shaped tip.

FIG. 2A is a schematic illustration of the micro sample heating probe 1*a* that employs a metallic wire with an acute-angled tip, and FIG. 2B is a schematic illustration of the micro sample heating probe 1*b* that employs a metallic wire with a circular-arc shaped tip. In the following description, both of the probes above are referred to as the micro sample heating probe 1, unless otherwise distinguished.

The heated parts 121*a* and 121*b* are different only in shape. Therefore, firstly, a common property will be explained, naming these elements generically as "heated part 121". As for the shape, it will be described later.

The micro sample heating probe 1 is provided with a sample holder 10 for holding the micro sample, a supporting part 6 for supporting the sample holder, a terminal part 4 for mounting these elements on the analyzer, and the metallic wiring 5.

The sample holder 10 is made up of the heated part 121 including the tip, and the other part, i.e., non-heated part 122.

The sample holder 10 incorporates two metallic wires, having different diameters respectively, so as to enhance a local heating property of the heated part 121. Here, the metallic wire at the tip, having a smaller diameter, is referred to as the heated part 121, and the part having a larger diameter is referred to as the non-heated part 122.

The heated part 121 is a metallic wire having the diameter (ϕ1) smaller than that of the non-heated part 122. By way of example, the heated part 121 is made up of Pt wire of approximately 5 μm in diameter and approximately 200 μm in length.

The non-heated part 122 is a metallic wire having the diameter (ϕ2) larger than the heated part 121, and constitutes the sample holder 10 together with the heated part 121. For example, the non-heated part 122 is made up of Ag wire, approximately 80 μm in diameter and approximately 2 mm in length.

It is to be noted that a Pt wire of 5 μm in thickness, extending from the heated part 121, passes through the central part of the non-heated part 122, thereby establishing a dual structure. In addition, the non-heated part 122 is electrically connected to the terminal part 4 made up of metal, via the metallic wiring 5 that passes through inside of the supporting part 6.

The sample holder 10 as described above is heated by Joule heat that occurs upon energization. On this occasion, since a resistance value of the heated part 121 on the tip is high, the temperature of the heated part 121 becomes extremely high locally. On the other hand, at the non-heated part 122 having a low resistance value, the temperature is hardly raised.

In addition, it is desirable that the area of the heated region of the heated part 121 as described above is $5\times10^5$ μm$^2$ or less. If a wire of φ100 μm is used, the length becomes 1.6 mm. In the situation as described above, the volume of the wire becomes $1.2\times10^7$ μm$^3$. Therefore, it is necessary to make the volume of the heated part 121 to be approximately $1\times10^7$ μm$^3$ (0.01 mm$^3$) or less.

The supporting part 6 is made up of insulating material, for instance, thereby strengthening the stiffness of the probe itself.

The terminal part 4 is made of a metal, and the probe is mounted on an appropriate portion of the analyzer and fixed thereon.

It is to be noted that the supporting part 6 and the terminal part 4 are provided with a current introduction mechanism as appropriate, so as to establish a configuration enabling power supply to the probe.

The metallic wiring 5 connects the non-heated part 122 and the terminal part 4. The metallic wiring 5 is a copper wire of 1 mm in diameter, for instance.

Figure 3:
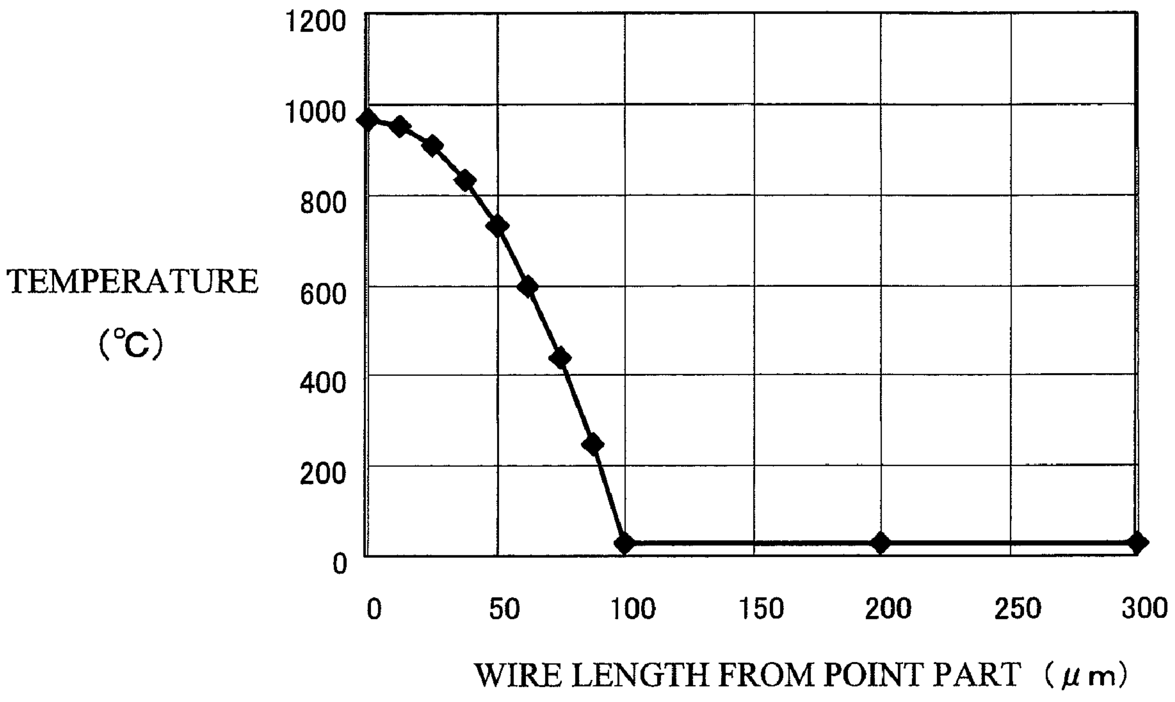
FIG. 3 is a chart illustrating attained temperature at each position, when 0.45V was applied to both ends of the terminal part 4 of the micro sample heating probe 1.

Since it is difficult to actually measure the attained temperature of the sample holder 10, FIG. 3 illustrates an example of the temperature simulation of the probe.

FIG. 3 is a graph illustrating the attained temperature at each position when 0.45V is applied to both ends of the terminal part 4 of the micro sample heating probe 1 relating to the present invention.

As shown in FIG. 3, the tip of the heated part 121 achieves approximately 1,000° C., and upon deviating from the tip, the attained temperature drops steeply. On the non-heated part 122 (100 μm or more distant from the tip), there is almost no temperature rise.

Actually, when the sample holder 10 of the probe was observed by an optical microscope while actually applying voltage, only the temperature of the heated part 121 became high and a red-heated state was observed. On the other hand, it was confirmed that the non-heated part 122 remained at a low temperature.

Next, extraction of the micro sample will be explained, actually using the micro sample heating probe 1 relating to the present embodiment.

In the present embodiment, the micro sample heating probe 1 was used for trying an extraction of a polystyrene bead of approximately 3 μm in diameter.

For the extraction, a micromanipulator was employed, which was driven by a commercially available stepping motor.

Firstly, a connector was produced enabling the terminal part 4 on the opposite side of the probe tip to fit into the tip of the manipulator without any looseness, in order that the micro sample heating probe 1 of the present invention was allowed to be mounted easily on a commercially available manipulator. This connector was structured enabling the application of voltage to the metallic terminal part 4 of the probe.

Here, since the supporting part 6 strengthened the stiffness of the probe itself, there was no problem in the strength of the probe, and the heated part 121 was able to extract the polystyrene bead.

Next, the polystyrene bead was kept attached to the heated part 121 of the probe, and while subjected to a microscopic observation in the air, a voltage was applied between the terminals of the terminal part 4 which has an electrode function.

As a result, when approximately 0.35V of voltage was applied, the polystyrene bead disappeared.

Accordingly, it was confirmed that the micro sample heating probe 1 of the present invention was capable of extracting an organic micro sample of several μm, and it was suitable for heating the sample, so as to vaporize and thermally decompose the sample.

Next, a shape of the heated part 121 will be explained in detail.

The micro sample heating probe 1*a* as shown in FIG. 2A and the micro sample heating probe 1*b* as shown in FIG. 2B are different in shape of the heated part 121.

The heated part 121*a* of the micro sample heating probe 1*a* is made of a metallic wire with an acute-angled tip, and the heated part 121*b* of the micro sample heating probe 1*b* is made of a metallic wire with a circular-arc shaped tip.

In the present embodiment, the shape of the heated part 121 is defined by a curvature radius of the metallic wire.

Specifically, as shown in FIG. 2A, if a metallic wire of 5 μm in diameter is employed, a shape having the curvature radius ranging approximately from 10 to 20 μm is suitable for the sample ranging in size approximately from 3 to 5 μm. As for the sample of approximately 10 μm in size, a shape having the curvature radius ranging approximately from 30 to 50 μm is preferable.

For example, if the sample is paste-like and spreads across a wide area, a shape having a large curvature radius as shown in FIG. 2B is suitable.

Specifically, for the paste-like sample spreading to four directions, 20 μm or more in each direction, it is desirable to set the curvature radius ranging approximately from 50 to 100 μm. It is because the sample is caught inside the circular arc shaped heated part 121*b*, thereby facilitating the extracting of the sample.

The explanation above has been made, assuming that the diameter of the metallic wire is 5 μm. However, the diameter of the metallic wire functioning as the heated part 121 may also be selected appropriately in accordance with the sample, such as the size and the form (hardness, softness) of the sample.

By way of example, if the diameter of the wire of the heated part 121 is extremely thick, observation during the sample extraction becomes difficult. On the other hand, if the diameter of the wire at the probe tip is extremely thin, stiffness of the wire is lowered, and the probe tip may be deformed or damaged when the sample is extracted, resulting in that the extractive property is extremely deteriorated.

More particularly, the size of the sample which ranges approximately from 3 to 10 μm may cause a defect of an LCD panel and the like, make the analysis harder, and cause a yield deterioration. Therefore, the diameter ranging approximately from 1 to 10 μm may be preferable as the diameter of the metallic wire of the heated part 121.

In addition, if the size of the sample as an analysis target ranges approximately from 1 to 20 μm, it is preferable that the thickness of the metallic wire ranges approximately from 0.5 to 20 μm.

Here, Table 1 shows a rough relationship between the target sample size and the curvature radius appropriate for the metallic wire diameter to be used.

TABLE 1

| | SAMPLE SIZE | | | |
|---|---|---|---|---|
| WIRE DIAMETER | 0.5~3 μm | 3~5 μm | 10~20 μm | 30~50 μm (broad paste) |
| 10 μm | — | r = 20~30 μm | r = 30~50 μm | r = 50~150 μm |
| 5 μm | r = 10~15 μm | r = 10~20 μm | r = 20~50 μm | r = 50~100 μm |
| 1 μm | r = 5~10 μm | r = 7~15 μm | — | — |

In the present embodiment, a copper wire having a diameter of 1 mm was employed as the wiring 5 passing through inside the supporting part 6, but other material may be used. However, it is preferable that its material and shape allows the resistance to be lowered sufficiently.

The supporting part 6 may be made of any material as far as it ensures stiffness. In the case where the wiring 5 passes through inside the supporting part 6, as described in the present embodiment, the supporting part 6 needs to be made of an insulating material. In addition, since the supporting part is introduced into a vacuum chamber when mass analysis is conducted, it is preferable to select a material that generates sufficiently small amount of gas.

The micro sample heating probe 1 of the first embodiment has been explained so far.

According to the present embodiment, by using the micro sample heating probe 1, it is possible to efficiently heat only the extracted sample. On the other hand, it is possible to maintain a temperature low at the portion other than the heated part 121, a temperature therein locally rises high. Therefore, the inner volume of the region where the temperature reaches high is small, thereby it is possible to suppress contamination. Consequently, it is possible to conduct analysis at a favorable S/N ratio.

Second Embodiment

Next, there will be explained a method of making the micro sample heating probe 1, having the heated part 121 with the diameter made up of multiple steps, which has been explained in the first embodiment of the present invention.

As a wire of the heated part 121*a* of the micro sample heating probe 1*a* relating to the present embodiment, a wire referred to as "Wollaston wire" is employed, which is made by coating a thin Pt wire with Ag. This wire has a structure that Pt of ϕ5 μm is embedded into the center of the Ag wire of ϕ80 μm. The sample holder 10 having the heated part 121*a* is formed by the use of this wire.

Firstly, the wire as described above is molded into a shape of the sample holder 10, and it is connected to the probe. Then, only the tip of the sample holder 10, which corresponds to the heated part 121*a*, is dipped into $HNO_3$ solution. Ag dissolves in $HNO_3$ solution, but Pt does not dissolve therein. Therefore, only Ag coating Pt is removed and Pt is exposed.

When the exposed portion of Pt becomes a desired length, the tip of the sample holder 10 is washed by purified water, and thereafter, subjected to ultrasonic cleaning by acetone.

As thus described, as shown in FIG. 2A, making of the micro sample heating probe 1*a* is completed, which has a configuration that only the tip (heated part 121*a*) is made up of an extremely thin wire.

When the probe is used for the mass analysis, it is preferable to energize the probe once before usage, so as to eliminate contamination of the heated part In the present embodiment, Wollaston wire of Pt is taken as an example for explanation, but it is alternatively possible to employ Pt—Rh Wollaston wire.

As described in the first embodiment, the thickness of the heated part 121*a* may be selected according to the specific purposes.

As a matter of course, the curvature radius of the heated part 121 is not limited to the acute angle as shown in FIG. 2A. By way of example, as shown in FIG. 2B, it is further possible to make the circular arc-shaped heated part 121*b*, by the method as described above.

Third Embodiment

Next, another method of making the heated part 121 will be explained with reference to the accompanying drawings.

Figure 4A:
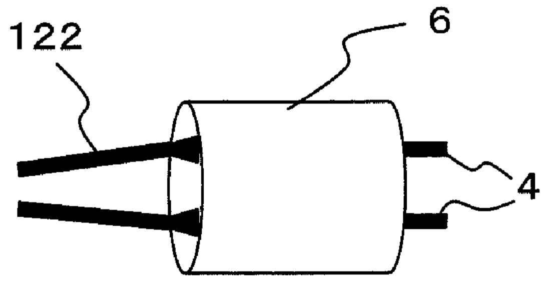
FIG. 4A is a schematic illustration of the micro sample heating probe 1 before adhesion of the heated part 121.

Firstly, as shown in FIG. 4A, a probe on which a wire is mounted is produced, the wire not being connected at the tip of the sample holder 10.

Here, it is assumed that the material of the tip wire is Cu, the diameter is 1 mm, and the exposed part of the wire is approximately 10 mm in length.

Figure 4B:
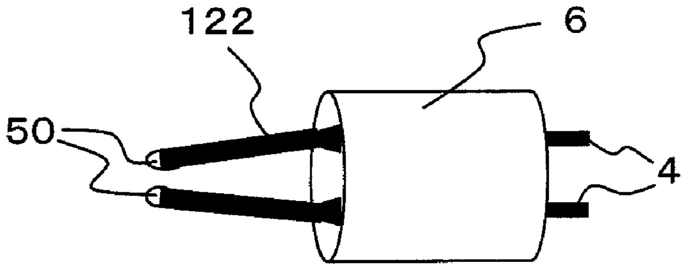
FIG. 4B is a schematic illustration of the micro sample heating probe 1 to which Ag paste is applied.

Next, as shown in FIG. 4B, Ag paste 50 is applied to the wire tip of ϕ1 mm.

Figure 4C:
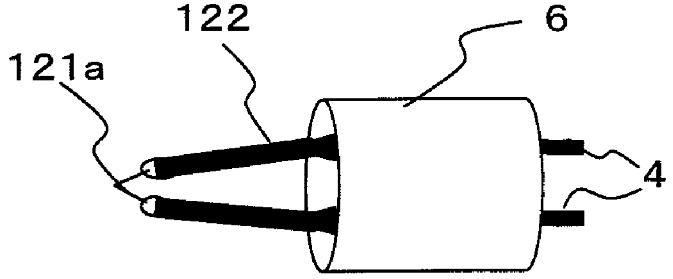
FIG. 4C is a schematic illustration of the micro sample heating probe 1 after adhesion of the heated part 121.

Then, as shown in FIG. 4C, a thin wire, which is processed into v-shape in advance for the heated part 121*a,* is connected to the probe tip via the Ag paste 50.

The material of the thin wire connected to the probe tip is Pt, and the diameter is set to ϕ10 μm. It is to be noted here that the length of the heated part 121*a* is approximately 2 mm.

Those operations described above can be performed under the stereoscopic microscope with a magnification of around 30 times.

In the present example, the wires of different thickness are connected by the use of Ag paste. Such connection method is not limited to the way as described above, but another method may be available. For example, there is no problem if other methods are employed, such as welding and wire bonding.

As a matter of course, the making method of the present embodiment also enables the production of the circular arc-shaped heated part 121*b*.

Fourth Embodiment

Next, a micro sample heating probe of a system which heats the tip by laser irradiation will be explained, mainly as to a part different from the first embodiment.

Figure 5A:
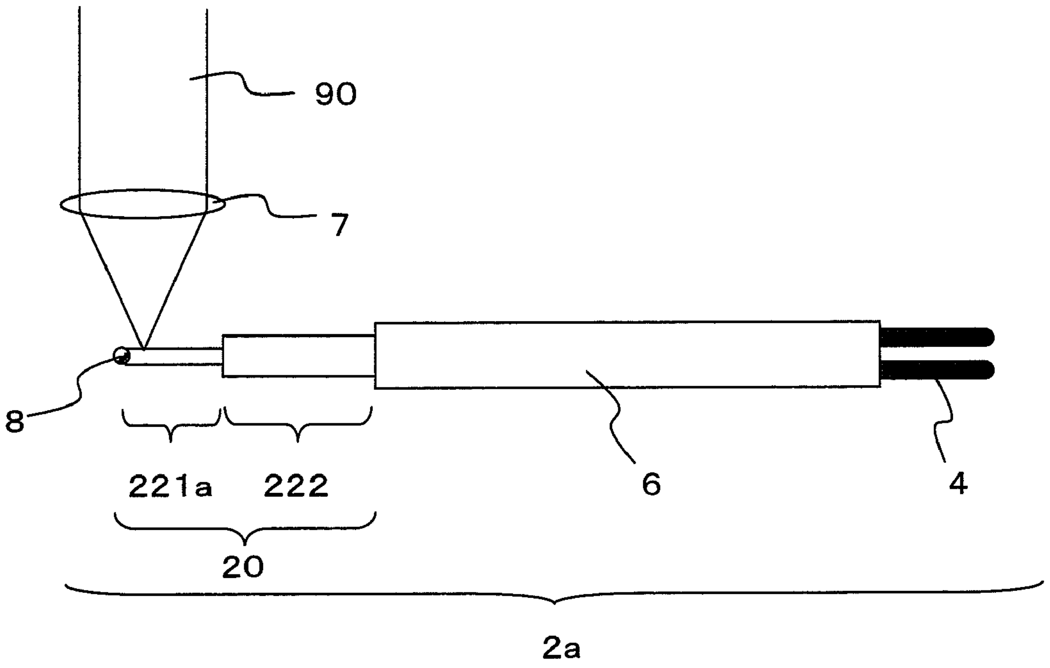
FIG. 5A is a schematic illustration of the micro sample heating probe 2*a* of a rod type having a sample holder 20 made up of multiple steps.
Figure 5B:
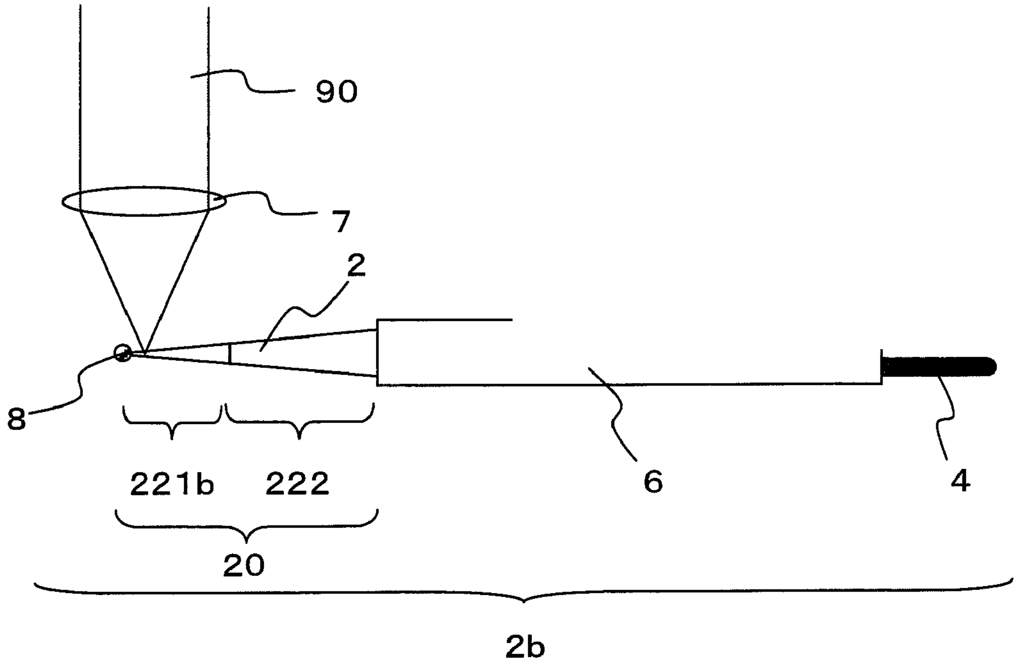
FIG. 5B is a schematic illustration of the micro sample heating probe 2*b* of a needle type having a needle-like sample holder 20.

FIG. 5A is a schematic illustration of the micro sample heating probe 2*a* of a rod type, having a sample holder 20 made up of multiple steps, and FIG. 5B is a schematic illustration of the micro sample heating probe 2*b* of a needle type, having a needle-like sample holder 20. In the following description, both of the probes above are simply referred to as the "micro sample heating probe 2", unless otherwise distinguished.

As shown in FIG. 5A, the micro sample heating probe 2*a* is provided with a sample holder 20 for holding a micro sample, a supporting part 6 for supporting the sample holder, and a terminal part 4 for mounting the elements above on the analyzer, and a metallic wiring 5.

The heated part 221*a* including the tip is formed in a cylindrical shape with a diameter smaller than the non-heated part 222, or in a flat-plate shape with a narrow width.

Here, in the present embodiment, a laser beam 90 is used as a heating source. The laser beam 90 is irradiated to a portion of the heated part 221*a,* via a condensing lens 7.

Here, if the laser beam 90 is collected and irradiated directly to the sample 8 held at the forefront end, the chemical bond of an organic polymer material may be broken and the organic polymer material becomes fragmented ions.

In addition, there are many unclear points as to a mechanism of desorption and ionization by direct irradiation of the laser beam, and it is varied significantly by the state of the sample. Therefore, it is extremely difficult to obtain a stable result in every analysis.

Therefore, the present embodiment takes a structure in which the laser beam 90 being collected is not directly irradiated to the sample 8, but irradiated to a portion of the heated part 221*a* in proximity to the sample.

With this structure, the portion to which the collected laser beam 90 is irradiated serves as a source for heating the heated part 221*a*.

On this occasion, since the diameter of the non-heated part 222 is larger than the diameter of the heated part 221*a,* the thermal capacity of the non-heated part 222 is higher than that of the heated part 221*a*. Consequently, the degree of temperature rise of the non-heated part 222 is much smaller than that of the heated part 221*a*.

Therefore, the temperature gradient of the heated part 221*a* at the probe tip becomes the highest at the laser collecting portion, serving as the heating source, and the temperature gradually becomes lower in proportion to the distance therefrom.

Furthermore, within the heated part 221*a*, the temperature drastically falls down in proximity to the non-heated part 222, due to the increase of the thermal capacity. As a result, on the heated part 221*a*, the temperature becomes high only in an extremely limited region, including a laser irradiated potion and the front end.

FIG. 5A illustrates a situation where the diameter is different between the heated part 221*a* and the non-heated part 222. However, as shown in FIG. 5B, it is further possible to employ the micro sample heating probe 2*b* with a needle-like sample holder 20, whose diameter changes continuously from the heated part 221*b* to the non-heated part 222.

Also in this case, the sample holder 20 is made up of the heated part 221*b* on the tip with a low thermal capacity, and the non-heated part 222 with a high thermal capacity, the non-heated part 222 having a diameter larger than that of the heated part 221*b*.

In practical use, it is possible to assume that a region that is heated up to 500° C. or higher, which is an approximate thermal decomposition temperature for an organic polymer compound, is the heated part 221*b*, and a region where the temperature ranges lower than 500° C. is the non-heated part 222.

Next, an explanation will be made as to a material that constitutes the heated part 221*a* and the heated part 221*b*. In the following description, both of the heated parts above will be simply referred to as the "heated part 221", unless otherwise distinguished.

In order to heat only the heated part 221 locally, it is preferable that a material with a low thermal capacity (or low specific heat) and a high thermal conductivity is used for the heated part 221, and a material with a high thermal capacity (or high specific heat) and a low thermal conductivity is used for the non-heated part 222.

In the case above, since it is necessary to use the thermal capacity of the micro sample heating probe 2 itself as an index, magnitude of the thermal capacity per unit volume determines an appropriate material.

Here, a value obtained by dividing the thermal conductivity by the thermal capacity per unit volume is used as an index for the temperature rise when a certain amount of energy is given. In this case, the material that has a high index value is preferable for the heated part 221.

Specifically, Au, Ag, Cu, Al, Mg, W, Si, and the like are available materials having such property as described above.

Among those materials, Au, Cu, W, Si, and the like are particularly preferable, which have a melting point of 1,000° C. or higher. From a similar point of view, materials Cr, Ni, Pt, Ti, Ta, Zr, Pd, Nb, and the like, are desirable as a material for the non-heated part 222.

Therefore, it is possible to say that a more preferable micro sample heating probe 2 is the one which incorporates the heated part 221 and the non-heated part 222, being made of heterogeneous materials as described above.

The combination of the materials as described above is common between the micro sample heating probe of the first embodiment and that of the second embodiment.

It is to be noted that joining of heterogeneous materials is possible by spot welding or the like. However, if it is difficult to configure the probe using heterogeneous materials, a configuration made of an identical material is also applicable. In the case above, it is preferable to make the diameter of the heated part 221 smaller than the diameter of the non-heated part 222. Alternatively, it is preferable to make the width of the heated part 221 to be smaller than the non-heated part 222, so as to generate a difference in the thermal capacity and thermal conductance therebetween.

In addition, the spot welding also enables two members, different in diameter or in width, to be joined.

With such a configuration as described above, collecting of the laser may facilitate realization of local heating. As a result, an influence by desorption of the organic matter, other than the sample, may be kept to the minimum. Furthermore, by combining various materials having different thermal capacities, a rate of temperature rise may be increased, thereby giving an advantage in thermal decomposition of polymer organic matter.

Fifth Embodiment

Figure 6:
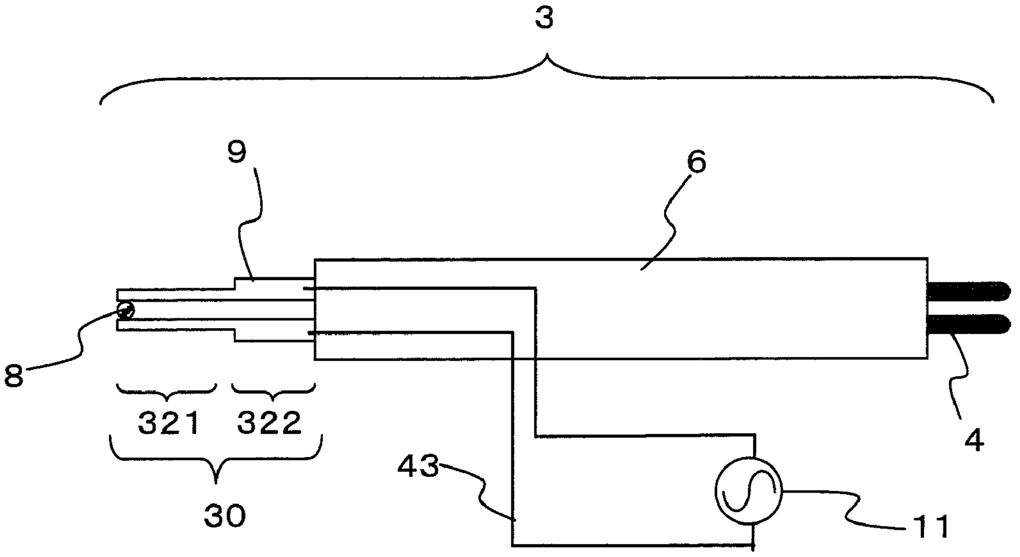
FIG. 6 is a schematic illustration of a micro sample heating probe 3 of tweezers type.

With reference to FIG. 6, a micro sample heating probe 3 of a type, just like using tweezers, for putting a micro sample therebetween for extraction will be explained.

As shown in FIG. 6, the micro sample heating probe 3 according to the present embodiment is provided with a sample holder 30 (arms 9) of tweezers type, which is made up of a heated part 321 having a first diameter (or a first sectional area), and a non-heated part 322 having a second diameter (or a second sectional area) larger than the first diameter (or a first sectional area).

The sample holder 30 is made up of the paired arms 9 and the sample 8 is held between the arms 9. Then, the sample 8 is heated by applying voltage to the paired arms 9.

If the sample 8 is conductive, the current flowing into the sample heats the sample 8 at the heated part 321, whichever current is applied, AC or DC.

Even if the sample 8 is an insulating member, it can be heated by applying a high frequency current. In this case, when the frequency is made higher, dielectric loss is made larger, thereby further increasing the heat release value.

As shown in FIG. 6, the micro sample heating probe 3 applies a high frequency to the arms 9, by a high-frequency power source 11 and the wiring 43. It is to be noted that an explanation as to a mechanism for driving the arms 9 is skipped here.

According to the configuration as described above, when an insulating micro sample such as an organic polymer material is heated, the micro sample works as a dielectric substance, and the arms 9 work as electrodes of the capacitor, whereby high-frequency dielectric heating is performed. On this occasion, an electric energy $P_0$ per unit volume is represented by the following formula:

$$P_0=(E/d)^2 \times \tan\delta \times 2\pi f \times \epsilon_0 \times \epsilon_r$$

Here, each term represents the followings:

E: Applied voltage (V)

d: Interelectrode distance (m) (which is equivalent to a distance between the arms of tweezers)

tan δ: Dielectric loss angle f: Frequency (Hz)

$\epsilon_0$: Vacuum dielectric constant ($8.85\times10^{-12}$ F/m)

$\epsilon_r$: Relative permittivity of dielectric substance

Therefore, since the electric energy $P_0$ is proportionate to the square of electric field intensity (E/d) and the frequency f, a high-frequency application condition may be set according to the size or the like of a target micro sample. Furthermore, if the sample size is approximately 1 μm ($\epsilon_r$=approximately 5), the frequency may be set to several tens of MHz and the application voltage may be set to several tens of voltages.

Commercially available MEMS tweezers made of Si are used as the sample holder 30, thereby enabling an extraction of the sample of approximately a few μm.

According to the micro sample heating probe 3 having such configuration as described above, the temperature of the heated part 321 is raised locally, which is the tip of the arms 9 of tweezers type. Therefore, this allows a user to conduct analysis at a favorable S/N ratio.

Sixth Embodiment

Next, an explanation will be made as to an analyzer provided with the micro sample heating probe.

Figure 7:
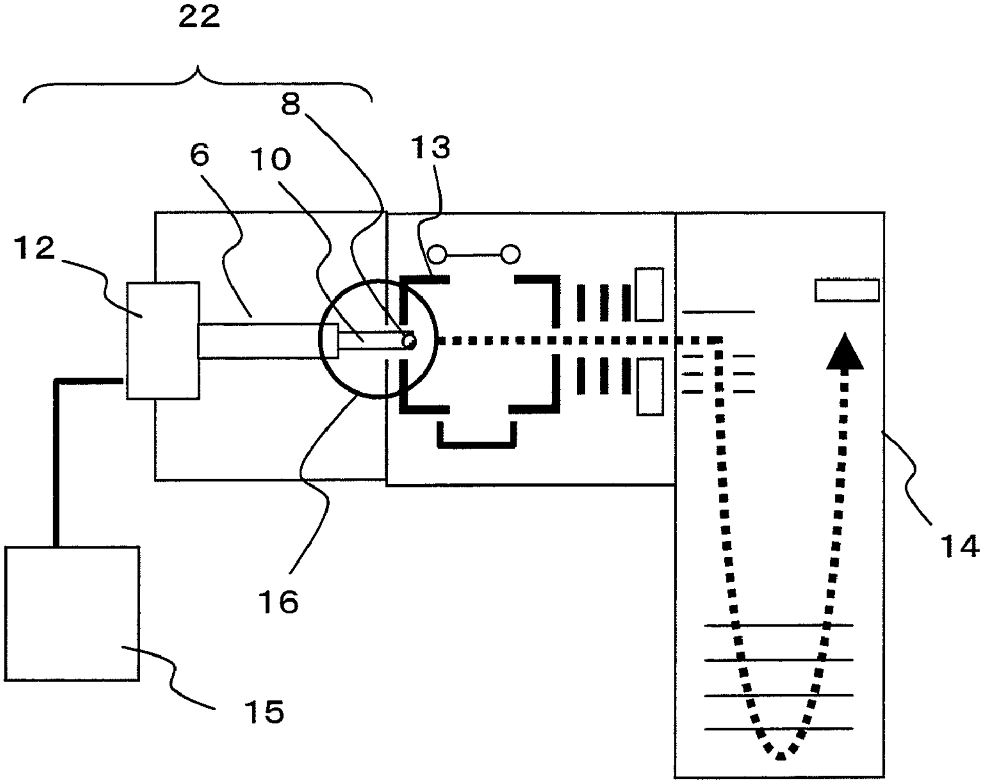
FIG. 7 is a schematic illustration of a mass spectrometer 60 to which the micro sample heating probe of the present invention is applied.

FIG. 7 is a schematic illustration of a mass spectrometer 60 to which the micro sample heating probe of the present invention is applied. Here, by way of example, an explanation will be made as to the case where the micro sample heating probe 1 relating to the first embodiment is connected to the mass spectrometer. As a matter of course, the micro sample heating probe relating to other embodiments may also be connected to the mass spectrometer.

The mass spectrometer 60 is provided with a sample introducer 22 including the coupling part 12 and the heating source 15, an ion source 13, and a TOF mass analyzer 14.

As shown in FIG. 7, the coupling part 12 is coupled with the terminal part 4 (not illustrated) of the micro sample heating probe 1, whereby the micro sample heating probe 1 can be mounted on the mass spectrometer 60.

The coupling part 12 is configured so that the heated part 121 of the sample holder 10 can be adjusted to be placed in proximity to the ion source 13 via the viewport 16.

The heated part 121 of the micro sample heating probe 1 is heated by the energy supplied from the heating source 15, the sample 8 being held is vaporized and ionized by the ion source 13, and then, it is guided to the TOF mass analyzer 14.

It is to be noted here that the mass spectrometer 60 of the present embodiment makes use of a TOF mass spectrometer. However, the present invention is not limited to this example, and a general-purpose quadrupole mass spectrometer can be employed, for instance.

As for a detection system, it is not limited to the mass analyzer. A spectroscopic analyzer may be employed, for instance.

When the micro sample heating probe 1 of the first embodiment is used, the heating source 15 is a DC power source. When the micro sample heating probe 3 of the fifth embodiment is used, the heating source 15 may be either the DC power source or a high-frequency power source. On the other hand, when the micro sample heating probe 2 explained in the fourth embodiment is used, a laser irradiation is required as the heating source. This will be explained in detail in the following embodiment.

Figure 8:
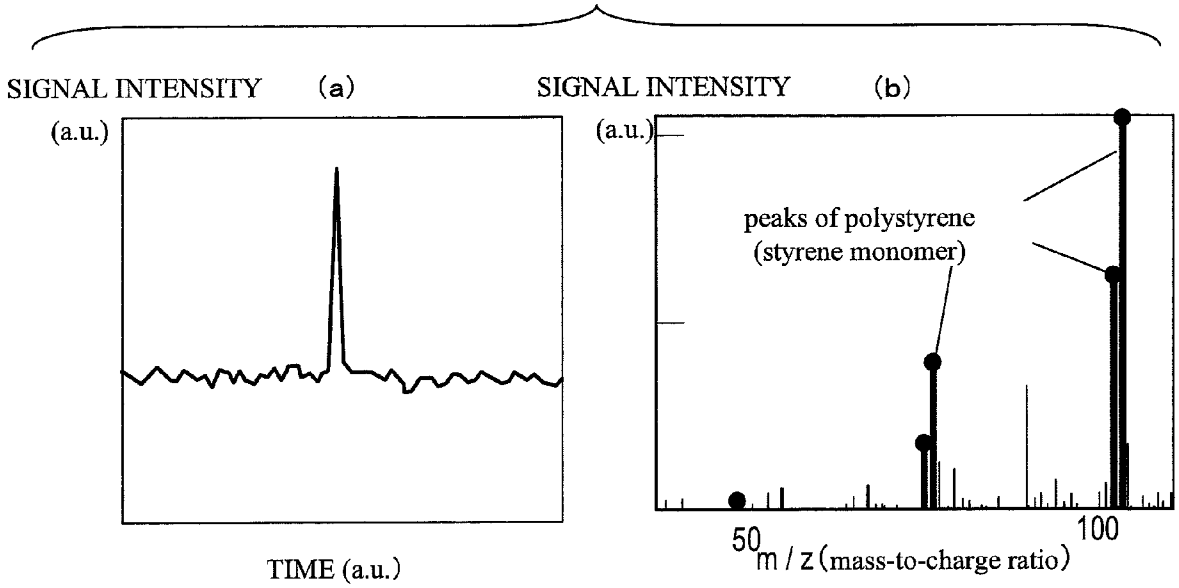
FIG. 8 illustrates charts of total ion chromatogram and mass spectrum of polystyrene beads.

Next, FIG. 8 shows a result of the mass analysis by using the micro sample heating probe according to the present invention.

FIG. 8 illustrates charts of (a) total ion chromatogram of one polystyrene bead of ϕ3 μm (approximately 15 pg), and (b) mass spectrum of the peaks.

As shown in FIG. 8, as a result of the mass analysis, an extremely sharp peak was obtained at a sufficiently high S/N ratio. According to the chart of the mass spectrum (b), it was found that most of the peaks were caused by a thermolysis product of polystyrene (styrene monomer), and almost no contaminated substance, other than the thermolysis product, was contained.

It was confirmed that the micro sample heating probe according to the present invention heats only the polystyrene being a sample as the analysis target, and it is quite effective for the analysis at a high S/N ratio.

In the description above, it has been explained that the micro sample heating probe 1 relating to the first embodiment is utilized in the mass spectrometer.

With the configuration above, it is possible to extract a sample by the micro sample heating probe and thereafter, the entire probe with the sample can be set on the analyzer. Therefore, a possibility of contamination can be reduced, allowing an acquisition of analysis result at a high S/N ratio.

Seventh Embodiment

Next, a mass spectrometer 70 will be explained, which incorporates a laser irradiation mechanism as a heating source, and employs the micro sample heating probe 2 described in the fourth embodiment.

Figure 9:
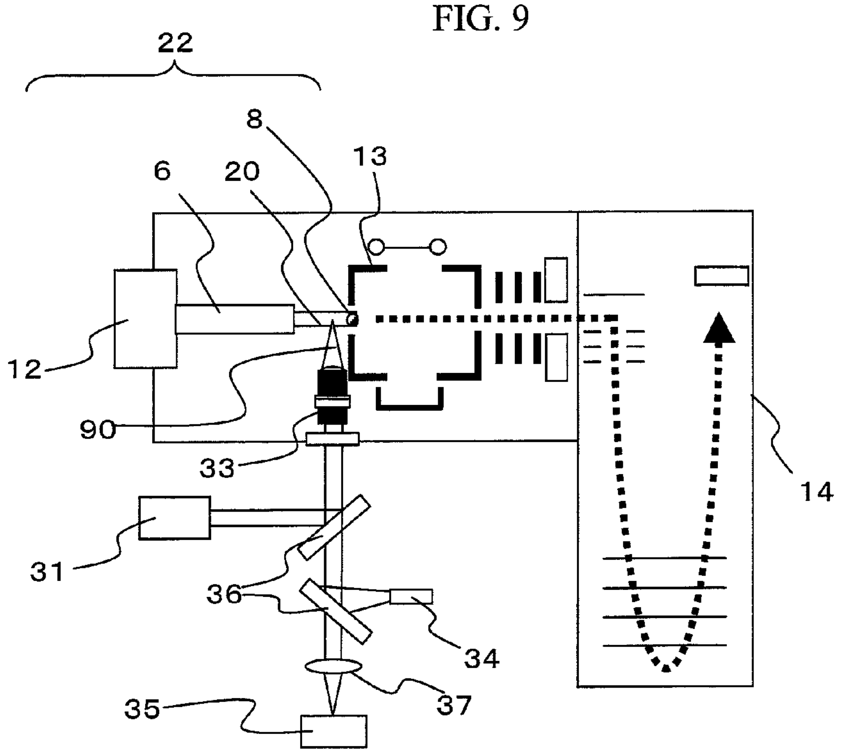
FIG. 9 is a schematic illustration of a mass spectrometer 70 to which the micro sample heating probe 2 of the present invention is applied.

FIG. 9 is a schematic illustration of the mass spectrometer 70 to which the micro sample heating probe 2 of the present invention is applied.

The mass spectrometer 70 has a laser emission mechanism as shown in FIG. 9, as the heating source of the sample introducer 22. The laser emission mechanism incorporates a laser oscillator 31, an objective lens 33 for collecting laser and observing the probe, an illumination lamp 34, a CCD camera 35 for observing an image of the probe, a beam splitter 36, and an imaging lens 37. The laser beam 90 being collected is irradiated to the micro sample heating probe 2.

A procedure of the analysis according to the mass spectrometer 70 will be explained.

Firstly, a sample 8 is extracted by using the micro sample heating probe 2, and the micro sample heating probe 2 with the sample 8 attached to the tip, is set to the coupling part 12 of the sample introducer 22.

Then, while an image of the probe tip is observed by the CCD camera 35, the laser beam 90 is irradiated to a portion of the heated part 221, at a position as shown in FIG. 5A and FIG. 5B, i.e., a position as close as possible to the sample, as well as avoiding a direct irradiation onto the sample 8.

As a result, the heated part 221 becomes high-temperature state, and according to the thermal conduction, the sample 8 is heated. As a result, the sample 8 is vaporized or decomposed, and released into the ion source 13. Then, the mass analysis is performed by the mass analyzer 14 as a detector.

As a result of measuring 1 μm of polystyrene bead according to the analyzing procedure as described above, a spectrum almost equivalent to the mass spectral chart (b) as shown in FIG. 8 is obtained, and it has been established that the present method enables an identification of a micro organic sample.

The micro sample heating probe 2 of the present embodiment was produced by etching, and the curvature radius of the tip was approximately several nanometers. When it was tried to extract 1 μm of sample by the micro sample heating probe 2, the extraction was carried out successfully.

Furthermore, in the present embodiment, a second harmonic of a YAG laser was used as the laser, and the pulse width of the laser was set to 100 ns. A distance between the laser collecting portion and the sample 8 being extracted was set to 1 μm, and the laser collecting diameter of the collecting portion was also set to approximately 1 μm.

In the present embodiment, a probe made of silicon was employed as the micro sample heating probe 2. However, it is further possible to use a probe made of another material, as described in the fourth embodiment.

Eighth Embodiment

Next, a gas chromatograph mass spectrometer 80 using the micro sample heating probe 1 relating to the first embodiment will be explained.

Figure 10:
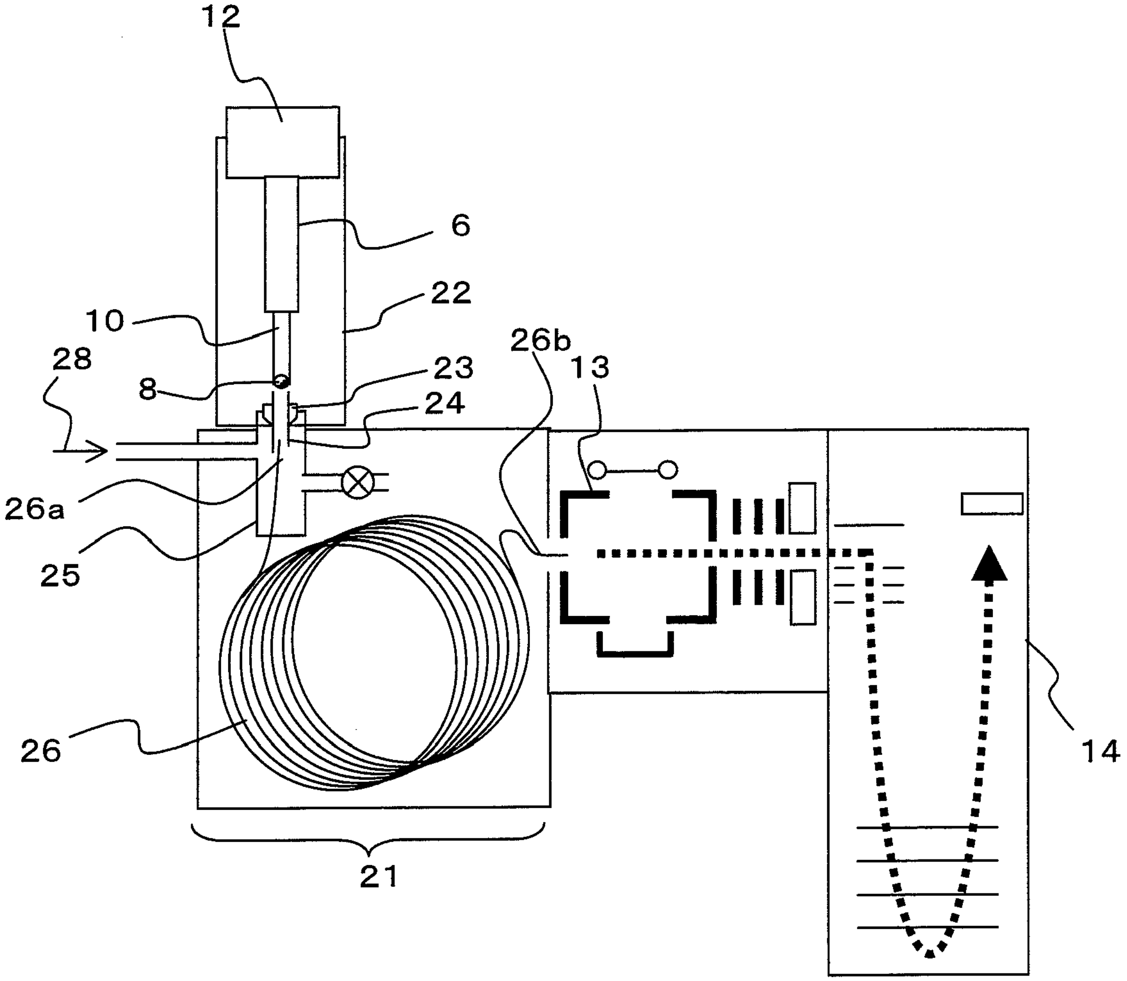
FIG. 10 is a schematic illustration of a gas chromatograph mass spectrometer to which the micro sample heating probe 1 of the present invention is applied.

FIG. 10 is a schematic illustration of the gas chromatograph mass spectrometer 80 to which the micro sample heating probe 1 of the present invention is applied.

The gas chromatograph mass spectrometer 80 incorporates a sample introducer 22, a gas chromatograph part 21, an ion source 13, and mass analyzer 14.

The sample introducer 22 is connected to a splitter 25 and a capillary column 26 via a needle 24 pierced through a septum 23.

The gas chromatograph part 21 is provided with the capillary column 26.

Firstly, an analysis procedure according to the gas chromatograph mass spectrometer 80 will be explained.

The micro sample heating probe 1 with the sample being extracted is mounted on the coupling part 12 of the sample introducer 22.

Then, energy is supplied from a heating source not illustrated to heat the heated part 121. Accordingly, the sample 8 held by the heated part 121 is vaporized and introduced into the capillary column inlet 26*a* together with carrier gas 28.

Afterwards, sample gas moved in the capillary column 26 is separated according to the unit of mass, and emitted from the capillary column outlet 26*b*. Then, the sample gas is ionized in the ion source 13, and guided to the mass analyzer 14.

In the present embodiment, the above analysis was actually performed by using as the probe, the micro sample heating probe 1 of metallic-line system.

The analysis was performed using as the sample, a few number of ϕ3 μm polystyrene beads held by the tip, and using He as the carrier gas 28. Consequently, a mass spectrum of styrene monomer was obtained.

It is to be noted here that the measurement conditions of the gas chromatograph were set as the following.

Applied column: micropolar, inner diameter 0.25 mm, length 30 m

Column inlet pressure: 100 kPa

Split ratio: 20

Condition of column temperature rise: 10° C./minute (270° C. at the maximum)

In addition, in the present embodiment, the micro sample heating probe 1 is employed, being a system in which electric current passes through a metallic wire. Alternatively, it is possible to employ the micro sample heating probe 2 that is heated by the laser irradiation as shown in FIG. 5A and FIG. 5B, and the micro sample heating probe 3 of tweezers type as shown in FIG. 6. If the micro sample heating probe 2 that is heated by the laser irradiation is used, a structure is just required, which allows the laser beam to be irradiated to the probe tip as shown in FIG. 9.

With the configuration using the gas chromatograph mass spectrometer as described above, even when the sample is made of a mixture, the sample gas is separated by the gas chromatograph (GC) in advance and then it is introduced into the mass analyzer, whereby it is possible to obtain an analysis result at a favorable S/N ratio.

Ninth Embodiment

Figure 11A:
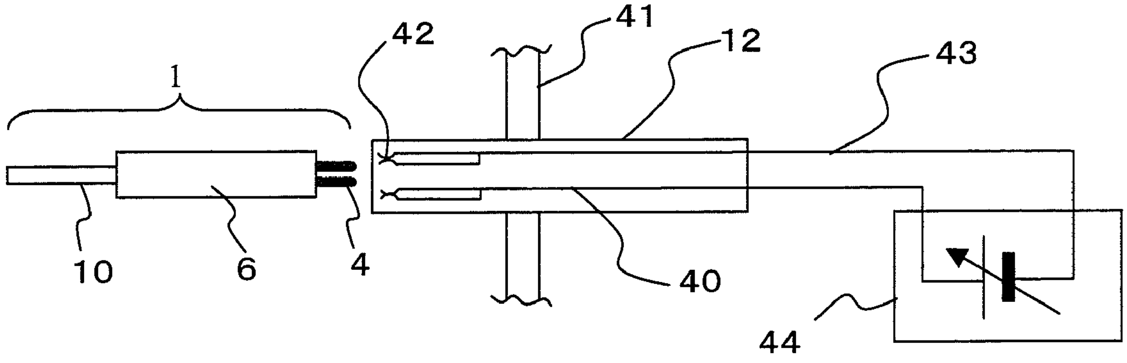
FIG. 11A is a schematic illustration showing a state that the micro sample heating probe 1 and coupling part 12 are not connected.
Figure 11B:
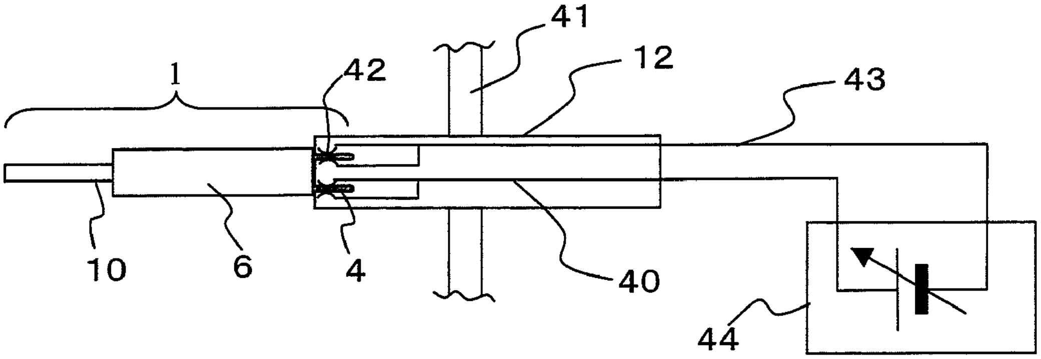
FIG. 11B is a schematic illustration showing a state that the micro sample heating probe 1 and the coupling part 12 are connected.

With reference to FIG. 11A and FIG. 11B, an explanation will be made regarding the coupling part 12 for mounting the micro sample heating probe on the analyzer.

FIG. 11A is a schematic illustration showing a state that the micro sample heating probe 1 and coupling part 12 are not connected, and FIG. 11B is a schematic illustration showing a state that the micro sample heating probe 1 and the coupling part 12 are connected.

It is to be noted here that in the present embodiment, an explanation will be made by using the micro sample heating probe 1 explained in the first embodiment, which requires an introduction of electric current.

The coupling part 12 accommodates an internal wiring 40 and electrodes 42 therein.

A power supply-temperature controller 44 and wiring 43 for supplying power to the coupling part 12 are placed outside of the enclosure 41 of the analyzer.

The internal wiring 40 formed in the coupling part 12 is electrically connected to the terminal part 4 via the electrodes 42.

The electrodes 42 are formed in metallic flat springs, and the terminal part 4 is placed therebetween to be held, in such a manner that the micro sample heating probe 1 can be easily attached and detached, within the device enclosure 41.

By using the analyzer with such coupling part 12 as described above, according to the manner similar to the first embodiment, a few number of ϕ3 μm polystyrene beads were extracted by the micro sample heating probe 1, and then, a mass spectrum of styrene monomer was observed.

In the present embodiment, an explanation is made, assuming that the coupling part 12 is fixed on the device enclosure 41, but the coupling part 12 is not necessarily fixed on the device enclosure 41. Another configuration is possible such that the coupling part 12 is separated from the device enclosure 41, firstly the micro sample heating probe is mounted on the coupling part 12, and thereafter these elements are mounted on the device enclosure 41.

In the present embodiment, an extremely thin Pt wire, being ϕ5 μm, was employed for the heated part 121 of the micro sample heating probe 1. Therefore, compared to the thermal capacity of the heated part 121, the thermal capacity of a normal thermocouple for measuring temperature is higher, and therefore, the temperature cannot be measured accurately by using the thermocouple.

Therefore, a calibration curve was created in advance between an input power and an attained temperature, by using a noncontact microscopic radiation thermometer, and the temperature was controlled based on the calibration curve. If a probe having a thermal capacity higher than the present embodiment is employed, and an accurate measurement of the temperature is possible by the thermocouple, the power control may be performed according to a real-time feedback.

In the present embodiment, the coupling part 12 was explained in the case where the micro sample heating probe 1 with the metallic wire was employed. However, the configuration may be the same even in the case where the micro sample heating probe 3 of tweezers type or the micro sample heating probe 2 of needle type is employed.

When the micro sample heating probe 3 is applied, a high-frequency power source is connected, instead of a DC power source. When the needle-like micro sample heating probe 2 is applied, an electrical connection from the outside is not necessary for the coupling part 12.

As a matter of course, in any of the above cases, it is quite natural that the tip of the probe is configured in such a manner as arranged at an appropriate place within the ionization chamber, when it is mounted on the mass spectrometer.

In the description so far, each of the embodiments relating to the present invention has been explained.

According to the micro sample heating probe relating to each of the embodiments of the present invention, the heated region is designed to be as small as possible, allowing the temperature to rise locally. Therefore, even when a contamination substance such as hydrocarbon is attached to the portion other than the heated region, such contamination substance is not vaporized, thereby enabling an analysis at a favorable S/N ratio.

Furthermore, since the micro sample heating probe of the present invention also functions as a mechanism for extracting a micro sample, the sample being extracted can be directly introduced into the analyzer. Therefore, it is further possible to suppress the possibility of contamination.

It is desirable that each heated part has a configuration which allows the temperature to rise to a target level, immediately or at a desired rate of temperature rise, according to an intended purpose of the analysis. In view of this point, the micro sample heating probe of the present invention is made in such a manner that the thermal capacity of the heated part is low and the thermal capacity of the non-heated part is high. Accordingly, this configuration enables a local heating, and further allowing the rate of temperature rise to be extremely high.

Furthermore, the micro sample heating probe of the present invention can be applied to an analysis other than the mass spectrometric analysis, for example, a spectroscopic analysis for analyzing gas.

What is claimed is:

1. A micro sample heating probe, comprising, a wire, a wire supporting member, a terminal being provided in the wire supporting member and supplying power to the wire, wherein, the wire further comprises a first wire having a first diameter for holding and heating a sample, and a second wire having a second diameter for connecting the first wire to the wire supporting member, wherein, the first diameter is smaller than the second diameter.

2. The micro sample heating probe according to claim 1, wherein, the terminal is provided with a power source.

3. The micro sample heating probe according to claim 1, wherein, the first wire is made of a material having a lower specific heat and higher thermal conductivity, than the material of the second wire.

4. The micro sample heating probe according to claim 1, wherein, the first wire contains at least Pt, and the second wire contains at least Ag.

5. The micro sample heating probe according to claim 1, wherein, a surface area of the first wire is equal to or less than 1 $mm^2$.

6. The micro sample heating probe according to claim 1, wherein, a volume of a heated region of the first wire is equal to or less than 0.01 $mm^3$.

7. The micro sample heating probe according to claim 1, wherein, a diameter of the first wire ranges from 1 to 20 μm.

8. A micro sample heating probe comprising, a rod, a rod supporting member, and a terminal provided in the rod supporting member, wherein, the rod further comprises a first rod having a first diameter for holding and heating a sample, and a second rod having a second diameter for connecting the first rod to the rod supporting member, wherein, the first diameter is smaller than the second diameter, and a predetermined position of the first rod is subjected to laser irradiation so as to heat the sample.

9. The micro sample heating probe according to claim 8, wherein, the first rod is made of a material having a lower specific heat and higher thermal conductivity, than the material of the second rod.

10. An analyzer for analyzing a micro sample, comprising, a sample introducer for vaporizing and introducing the micro sample, an ion source for ionizing the micro sample, a detector for detecting the micro sample, and a heating source, wherein, the sample introducer detachably connects a micro sample heating probe including a first member having a first diameter for holding and heating the micro sample to be introduced, and a second member having a second diameter that is larger than the first diameter.

11. The analyzer according to claim 10, further comprising, a gas chromatograph part for separating the micro sample held by the micro sample heating probe.

12. The analyzer according to claim 10, wherein, the detector is a mass analyzer having a function for performing separation according to ionic mass-to-charge ratio.

13. The analyzer according to claim 10, wherein, the micro sample heating probe comprises a terminal for supplying power to the first member and the second member, the heating source of the analyzer comprises an AC or DC power source, and the sample introducer supplies power from the heating source to the terminal, when connection of the terminal is established.

14. The analyzer according to claim 10, wherein, the heating source is a laser oscillator, and the laser is irradiated to the first member of the micro sample heating probe.

15. The analyzer according to claim 10, wherein, the first member and the second member constitute a tweezers structure made up of two pieces of arms, and the sample introducer applies a high frequency from the heating source to the two pieces of arms, when connection of the terminal is established.

* * * * *